United States Patent [19]
Chiu et al.

[11] Patent Number: 5,644,264
[45] Date of Patent: Jul. 1, 1997

[54] OUTPUT CIRCUIT WITH SHORT CIRCUIT PROTECTION FOR A CMOS COMPARATOR

[75] Inventors: Kwok-Fu Chiu; Don Roy Sauer, both of San Jose, Calif.

[73] Assignee: National Semiconductor Corporation

[21] Appl. No.: 616,397

[22] Filed: Mar. 15, 1996

Related U.S. Application Data

[62] Division of Ser. No. 295,135, Aug. 24, 1994, Pat. No. 5,525,934.

[51] Int. Cl.$^6$ .................................. H03K 5/08; H03K 5/22
[52] U.S. Cl. .................................. 327/318; 327/65
[58] Field of Search .................................. 327/65, 66, 67, 327/63, 310, 318, 321, 327, 328, 560–563, 307

[56] References Cited

U.S. PATENT DOCUMENTS

| | | | |
|---|---|---|---|
| 4,713,600 | 12/1987 | Tsugaru et al. | 323/351 |
| 4,996,443 | 2/1991 | Tateno | 307/264 |
| 5,077,489 | 12/1991 | Gola et al. | 327/63 |
| 5,115,151 | 5/1992 | Hull et al. | 327/65 |
| 5,287,517 | 2/1994 | Maskas et al. | 307/475 |
| 5,391,933 | 2/1995 | Rein | 327/65 |
| 5,399,915 | 3/1995 | Yahata | 327/108 |
| 5,541,538 | 7/1996 | Bacrania et al. | 327/563 |

OTHER PUBLICATIONS

Except from book entitled "Bipolar and MOS Analog Integrated Circuit Design" by Alan B. Grebene, Micro–Linear Corporation, John Wiley & Sons, 1984, pp. 258–260.
Article entitled "A Quad CMOS Single–Supply Op Amp with Rail–to–Rail Output Swing", by Dennis M. Monticelli, IEEE Journal, vol. Sc–21, No. 6, Dec. 1986, pp. 1026–1034.

*Primary Examiner*—Toan Tran
*Attorney, Agent, or Firm*—Skjerven, Morrill, MacPherson, Franklin & Friel; Edward C. Kwok

[57] ABSTRACT

An output stage of a CMOS comparator is designed to have a limited short circuit current, while maintaining maximum output voltage swing and a low quiescent current. The output stage includes a reference voltage generation circuit, which generates a gate voltage at the output transistor of limited range, so that the short circuit current of the output transistor is limited. In one embodiment, the reference voltage is generated by a plurality of serially connected diodes.

6 Claims, 9 Drawing Sheets

OUTPUT CIRCUIT WITH SHORT CIRCUIT PROTECTION FOR A CMOS COMPARATOR

This application is a division of application Ser. No. 08/295,135, filed 08/24/94 now U.S. Pat. No. 5,525,934.

BACKGROUND OF THE INVENTION

1. Field of the Invention

The present invention relates to the design of electronic circuits, and in particular, relates to the design of an output stage in a CMOS integrated circuit.

2. Discussion of Related Art

Short circuit protection is typically provided in an output stage of an integrated circuit to prevent inadvertent short circuit caused by shorting of an output pin, thereby resulting in large currents to flow in the output transistors. If not properly protected, these output transistors can be irreversibly or permanently damaged. Some methods of output short circuit protection are disclosed in Bipolar and MOS Analog Circuit Design, by Alan B. Grebene, pp. 257–260, published by John Wiley and Sons (1984).

FIG. 6a and 6b show two output stages 600 and 650 having short circuit protection schemes of the prior art. As shown in FIG. 6a, a logic signal to be output is provided at the input terminal 601 of an inverter 602, which includes transistors 602a and 602b. The output signal of inverter 602, which is provided at terminal 603, is used to drive a pull-up output transistor 604. Output stage 600 is provided a resistor 610 to sense the output current flowing from the supply voltage $V_{cc}$ to the output terminal 605. A pull-up transistor 606 is provided at the gate terminal of output transistor 604 to sense the voltage drop across the resistor 610, and to turn off output transistor 604, when the voltage at the gate terminal of transistor 606 is more than a threshold voltage below the supply voltage $V_{cc}$. A similar configuration is provided to the pull-down portion of output stage 600. In FIG. 6a, this pull-down configuration is represented by current source 607. The short-circuit protection scheme of output stage 600 is undesirable because both the output voltage swing at terminal 605 and the attainable gain in the output stage 600 are severely degraded.

In FIG. 6b, a logic signal to be output is provided at the input terminal 651 of an inverter 652, which includes transistors 652a and 652b. The output signal of inverter 652, which is provided at terminal 653, is used to drive a pull-up output transistor 654. The output signal of output stage 650 is provided at terminal 655. Output stage 650 is provided, instead of a resistor and a transistor, such as FIG. 6a's resistor 610 and transistor 606, a zener diode 660 to limit the output current by restricting the gate-to-source ("$V_{Gs}$") voltage of output transistor 654 to the breakdown voltage of zener diode 660. A similar configuration is provided to the pull-down portion of output stage 650. In FIG. 6b, this pull-down configuration is represented by current source 657. The output protection scheme of output stage 660 is undesirable, because a substantial leakage current is associated with zener diode 660 in certain manufacturer processes. The leakage current affects the value output short circuit current. Furthermore, the current in zener diode 660 under normal operation condition is high.

An example of an output stage of an amplifier using a zener diode to limit the output current is described in the article "A Quad CMOS Single-Supply Op Amp with Rail-to-Rail Output Swing" by D. Monticelli, published in *IEEE Journal of Solid-State Circuits*, Vol. sc-21, No. 6, December, 1986, pp.1026–34.

An alternative scheme, which replaces zener diode 660 by a number of serially connected diodes, is also possible. However, under this alternative scheme, the short-circuit current changes with the supply voltage. Further, under this alternative scheme, even though the leakage current of zener diode 660 is avoided, the current through the serially connected diodes remain high under normal operating conditions.

SUMMARY OF THE INVENTION

In accordance with the present invention, the present invention provides a comparator circuit, which includes: (a) an input protection circuit receiving a differential input signal and providing a differential output signal corresponding to the differential input signal; (b) an input stage circuit receiving the differential output signal, for providing a comparator output signal indicating whether the differential input signal is positive or negative; (c) an output stage circuit for amplification of the comparator output signal, the output stage including an output transistor having a gate terminal limited to a reference voltage between a first supply voltage and a second supply voltage; and (d) a bias circuit for providing a bias voltage used in the input protection circuit, the input stage circuit and the output stage circuit.

In accordance with another aspect of the present invention, an output circuit is provided. Such output circuit includes: (i) a reference voltage source providing a reference voltage between a first supply voltage and a second supply voltage; (b) a logic gate, coupled to the reference voltage source and an input signal, configured such that the logic gate provides an output signal limited in voltage by the reference voltage; and (c) an output transistor, having a gate terminal coupled to receive the output signal of the logic gate and a source terminal coupled to receive one of the first and second supply voltages, for providing at a drain terminal of the output transistor the output signal of the output circuit.

In one embodiment, the logic gate of the output circuit of the present invention is an inverter including: (a) a first transistor coupled to receive one of the supply voltages, a gate terminal coupled to receive the input signal of the output circuit, and a drain terminal; and (b) a second transistor having a gate terminal coupled to the gate terminal of the first transistor, a drain terminal coupled to the drain terminal of the first transistor and a source terminal coupled to receive the reference voltage.

In one embodiment, the output circuit of the present invention generates the reference voltage by serially connected diodes or serially connected diode-connected transistors.

In one embodiment of the present invention, a speed-up circuit for accelerating attainment of the reference voltage is also included to enhance the AC response of the output circuit.

Thus, the present invention provides short-circuit output protection without limiting the voltage swing in the output, or suffering a substantial leakage current, thereby avoiding high power dissipation.

The present invention is better understood upon consideration of the detailed description below and the accompanying drawings.

Detailed Description of the Preferred Embodiments

Figure 1:
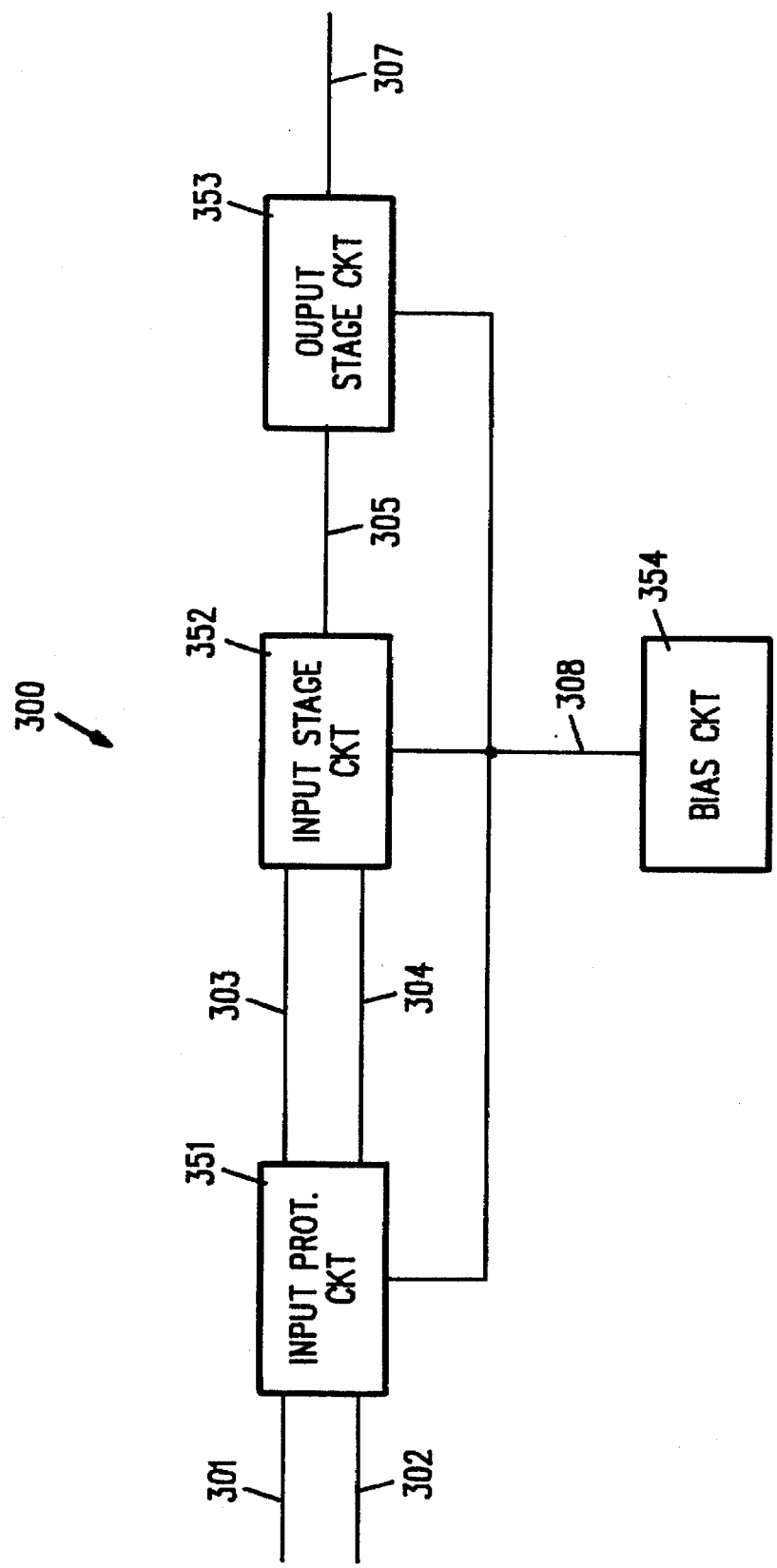
FIG. 1 shows a comparator 300, in accordance with one embodiment of the present invention.
Figure 3A:
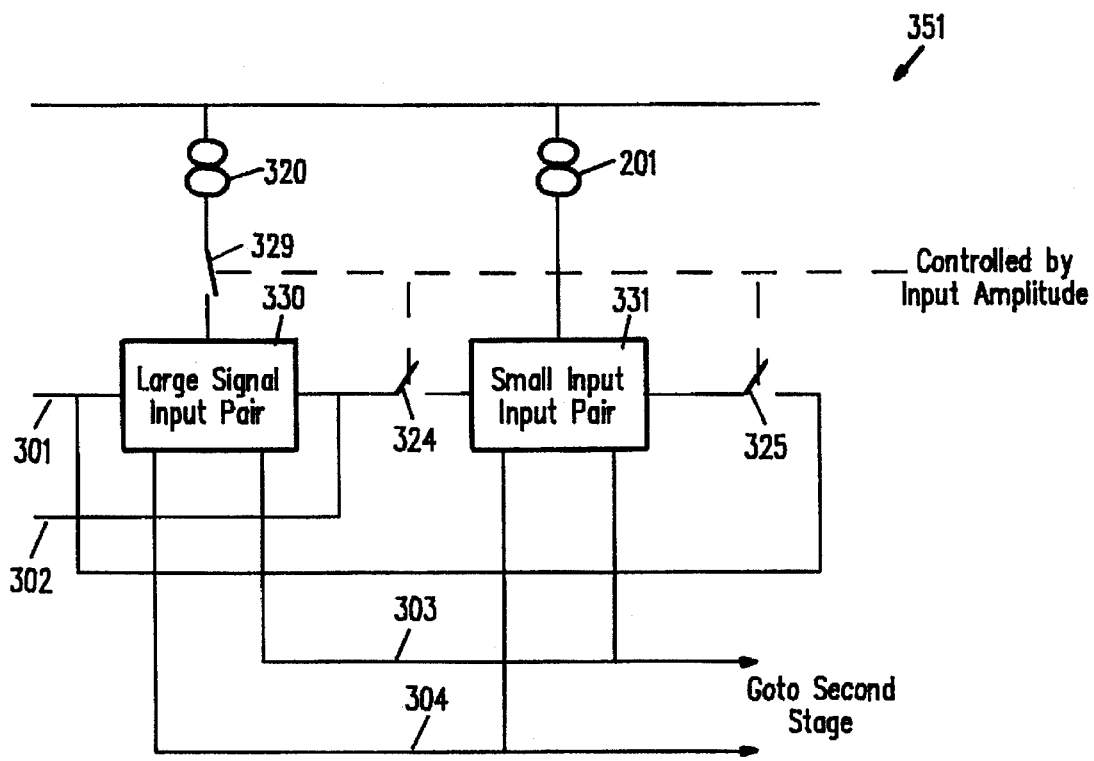
FIG. 3a is a block diagram of input protection circuit 351 of the present embodiment.
Figure 3B:
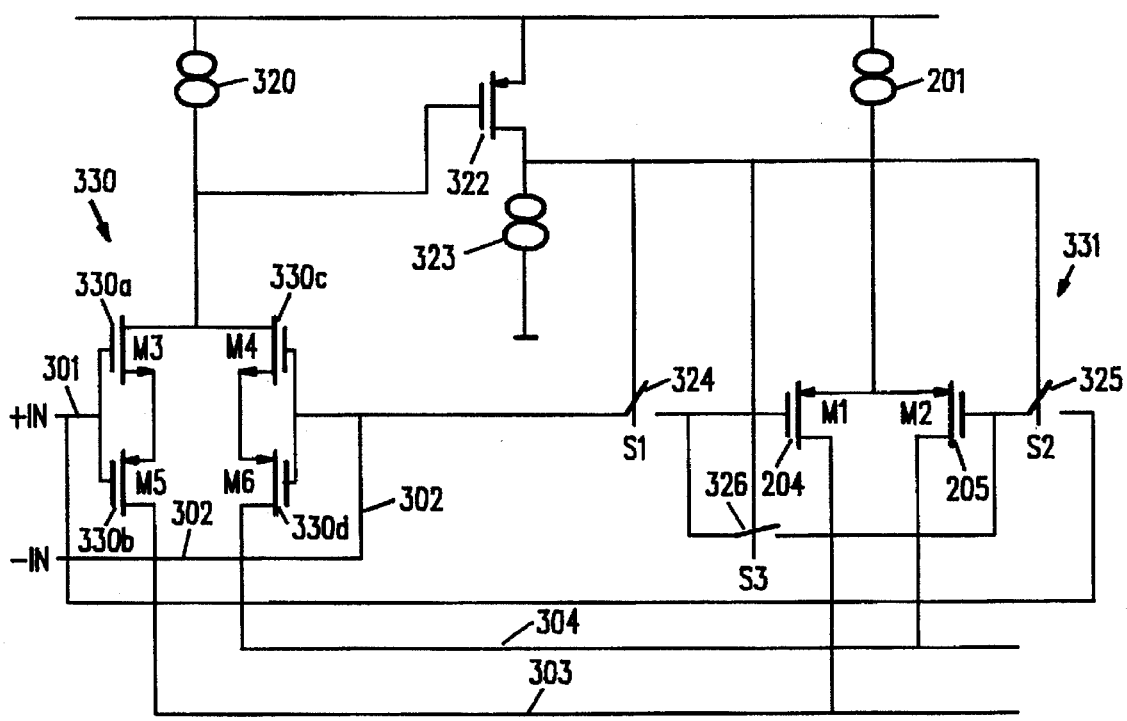
FIG. 3b a schematic circuit of input protection circuit 351 of the present embodiment.
Figure 3C:
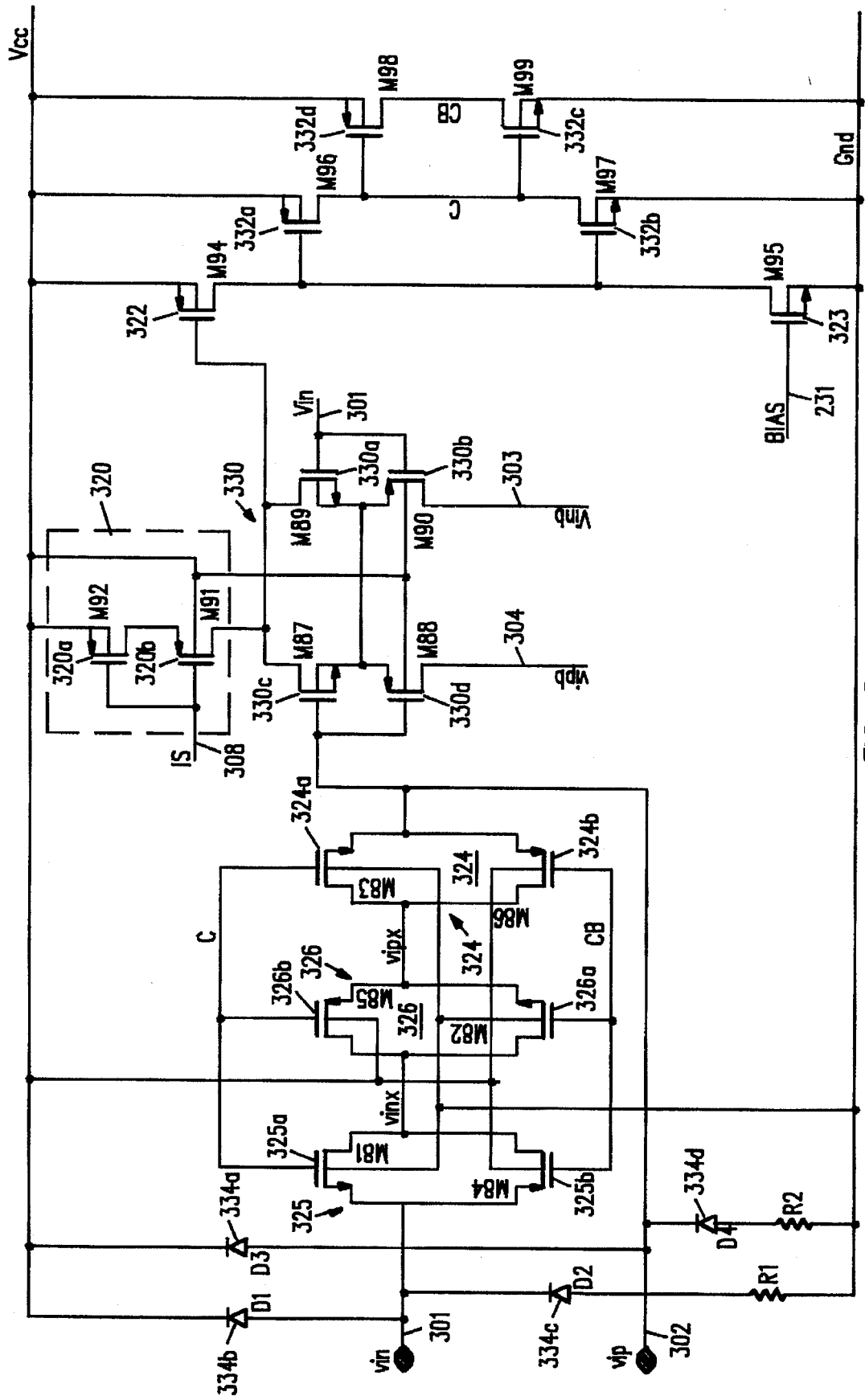
FIG. 3c is a transistor level schematic circuit showing in further detail input protection circuit 351 of the present embodiment.

One embodiment of the present invention is provided in a comparator circuit 300 shown in FIG. 1. FIG. 1 is a block diagram of comparator circuit 300, which can be implemented as a CMOS integrated circuit. As shown in FIG. 1, comparator 300 includes input protection circuit 351, input stage circuit ("AB cascode amplifier") 352, output stage circuit 353 and bias circuit 354. A differential signal is received into input protection circuit 351 across terminals 301 and 302. Input protection circuit is designed to minimize comparator 300's "$V_{os}$" (offset voltage) performance. FIGS. 3a, 3b and 3c are respectively a block diagram and a schematic circuit, and a transistor level schematic circuit for input protection circuit 351, which is described in further detail in copending patent application entitled "Input Protection Circuit for a CMOS Comparator," by Kwok-Fu Chiu et al, Ser. No. 08/296,056, filed on the same day as the present application, assigned to National Semiconductor Corp., also the assignee of the present invention, bearing Attorney's Docket no. NS-2376. The detailed description of input protection circuit 351 and the accompanying drawings in the patent application, Attorney's docket number NS-2376, are hereby incorporated by reference. Input protection circuit 351 provides a differential output signal across terminals 303 and 304 substantially proportional to the differential input signal across terminals 301 and 302.

Figure 2A:
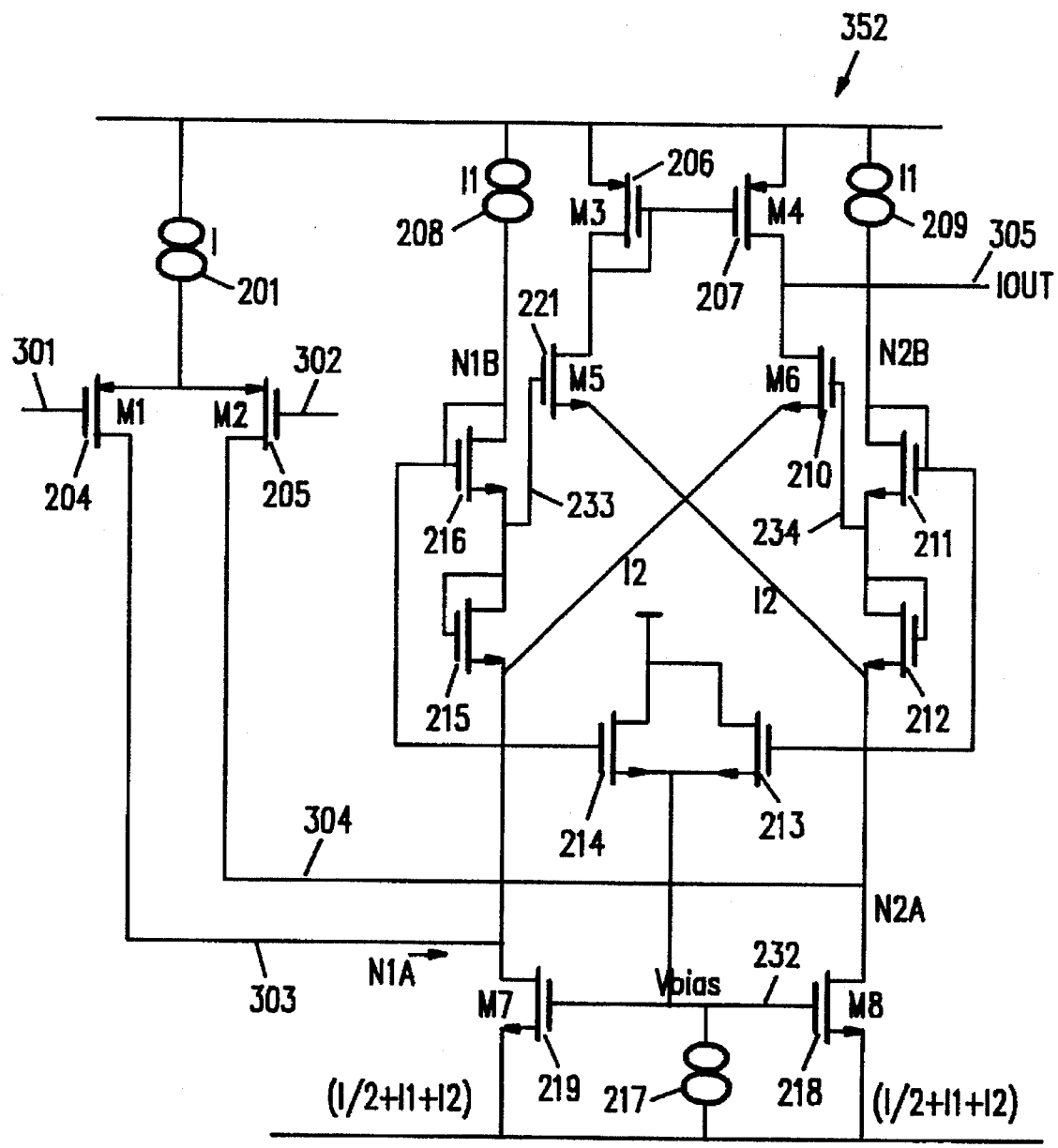
FIG. 2a is a schematic diagram of an AB cascode amplifier 352, in accordance with the present invention.
Figure 2B:
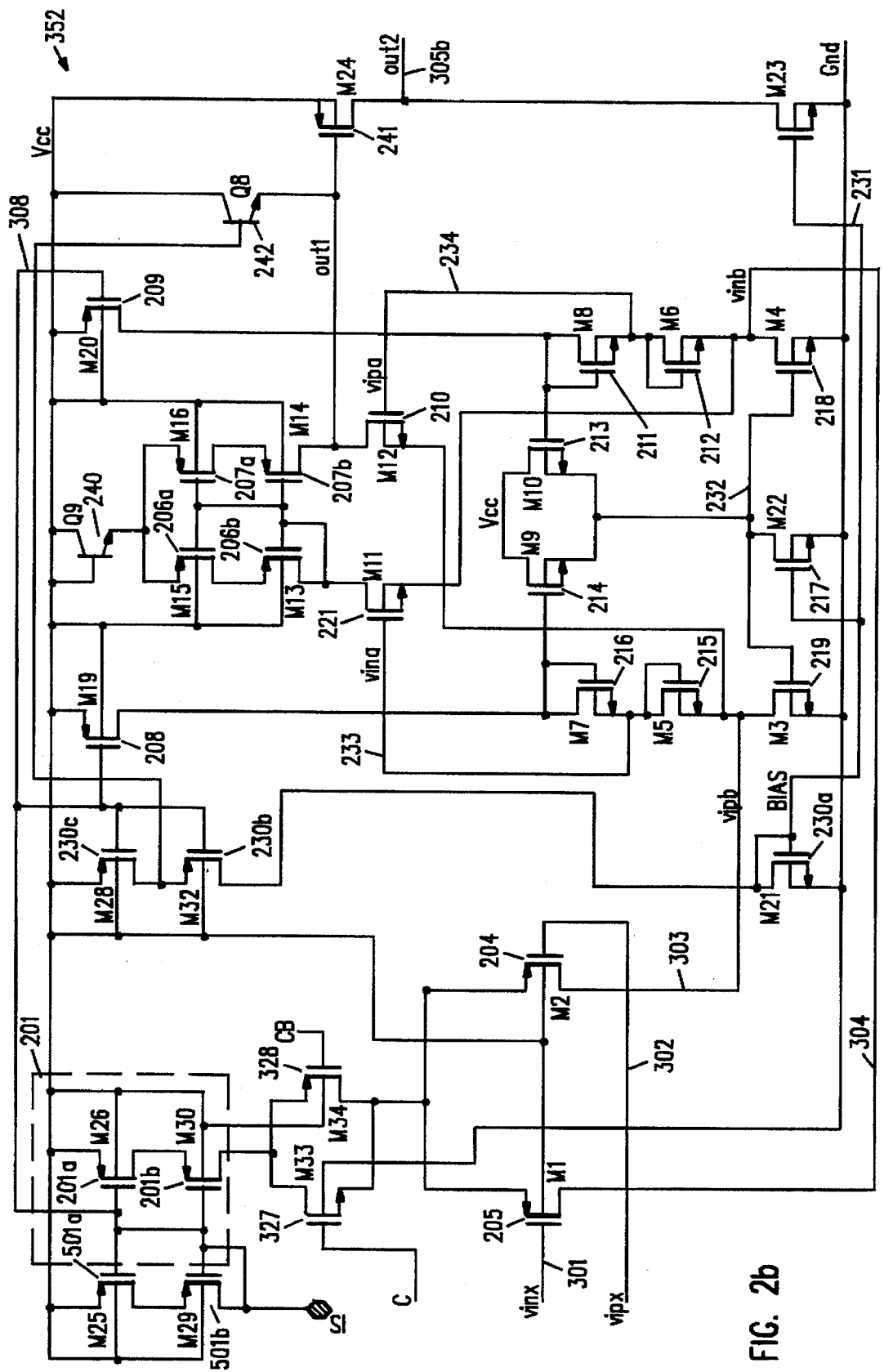
FIG. 2b is a transistor level schematic circuit showing in further detail the schematic diagram of AB cascode amplifier 352.

FIGS. 2a and 2b are, respectively, a schematic diagram and a transistor level schematic diagram of input stage circuit 352. Input stage circuit 352 is described in patent application entitled "AB Cascode Amplifier in an input stage of an Amplifier or Comparator," by Kwok-Fu Chiu et al, Ser. No. 08/296,057, filed on the same day as the present application, assigned to National Semiconductor Corp., also the assignee of the present invention, bearing Attorney's Docket no. NS-2378. The detailed description of input stage circuit 352 and the accompanying drawings in the patent application, Attorney's docket number NS-2378, are hereby incorporated by reference.

In response to the differential signal across terminals 303 and 304, input stage circuit 352 provides an output signal 305 which is indicative of whether the voltage at terminal 301 is higher than the voltage at terminal 302. The voltage $V_{os}$ represents the minimum voltage By which the voltage at terminal 301 must exceed the voltage at terminal 302 to drive the output signal at terminal 305 to "logic high".

Figure 4A:
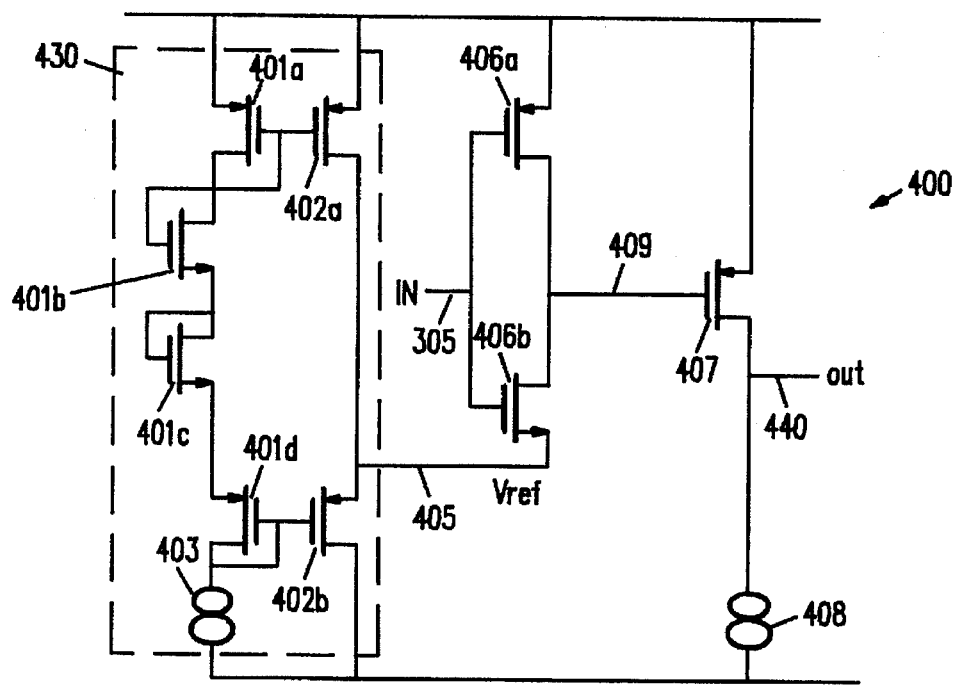
FIG. 4a is a schematic circuit of output stage circuit 353 of the present embodiment.
Figure 4B:
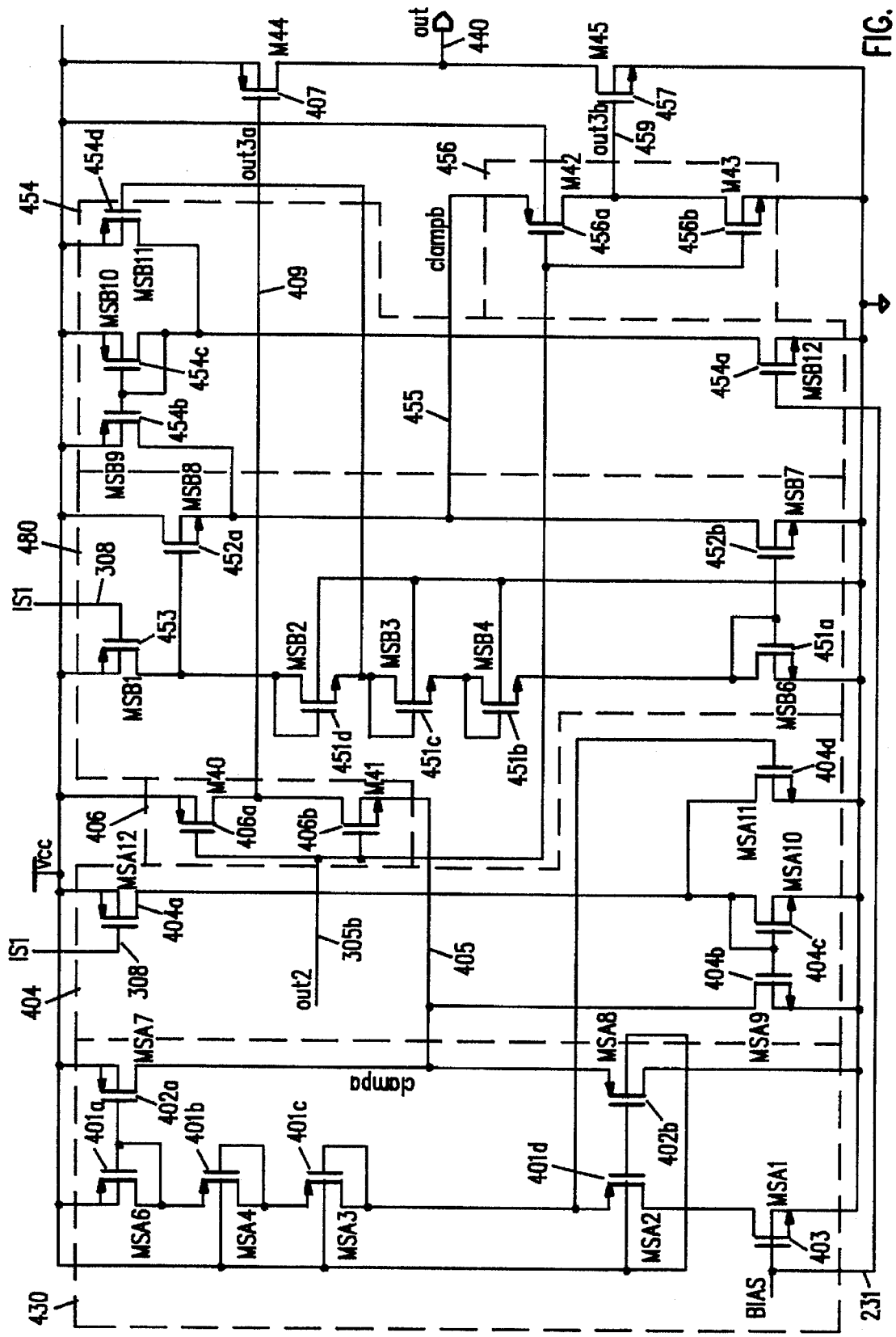
FIG. 4b is a transistor level schematic circuit showing in further detail output stage circuit 353 of the present invention.

The output signal at terminal 305 is amplified by output stage circuit 353 as the output signal of comparator 300. This output signal of comparator 300 is provided at terminal 307. Output stage circuit 353 includes a structure adapted for short circuit protection. FIG. 4a and 4b are schematic circuits of output stage 353, which is described in further detail below.

Figure 5A:
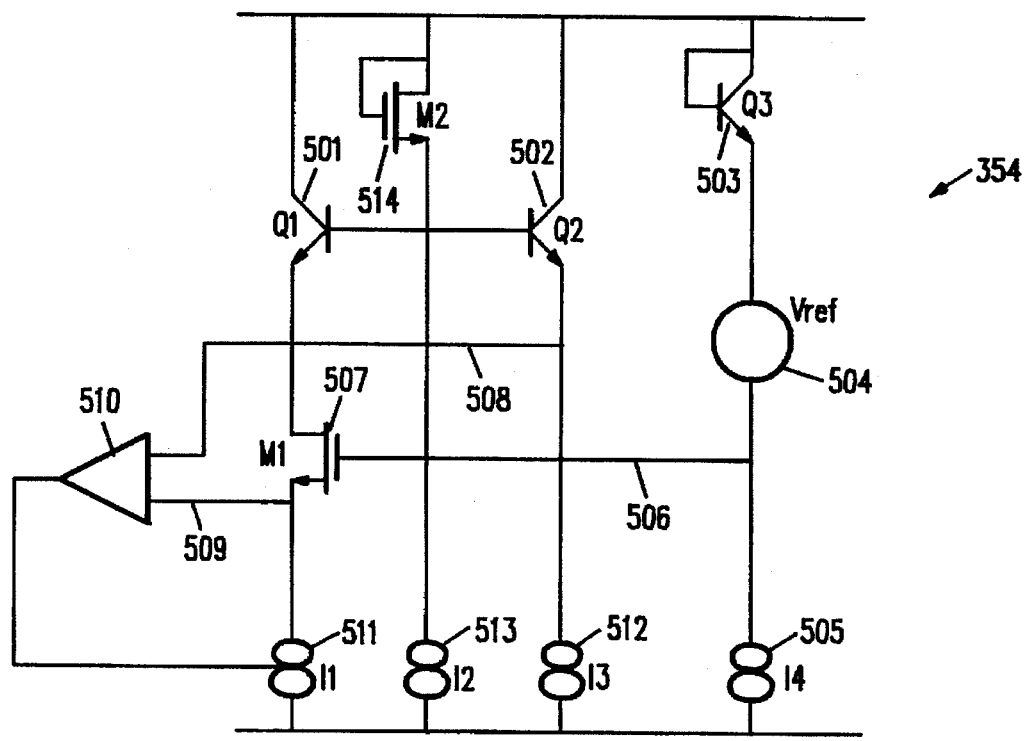
FIG. 5a is a schematic circuit of bias circuit 354 of the present embodiment.
Figure 5B:
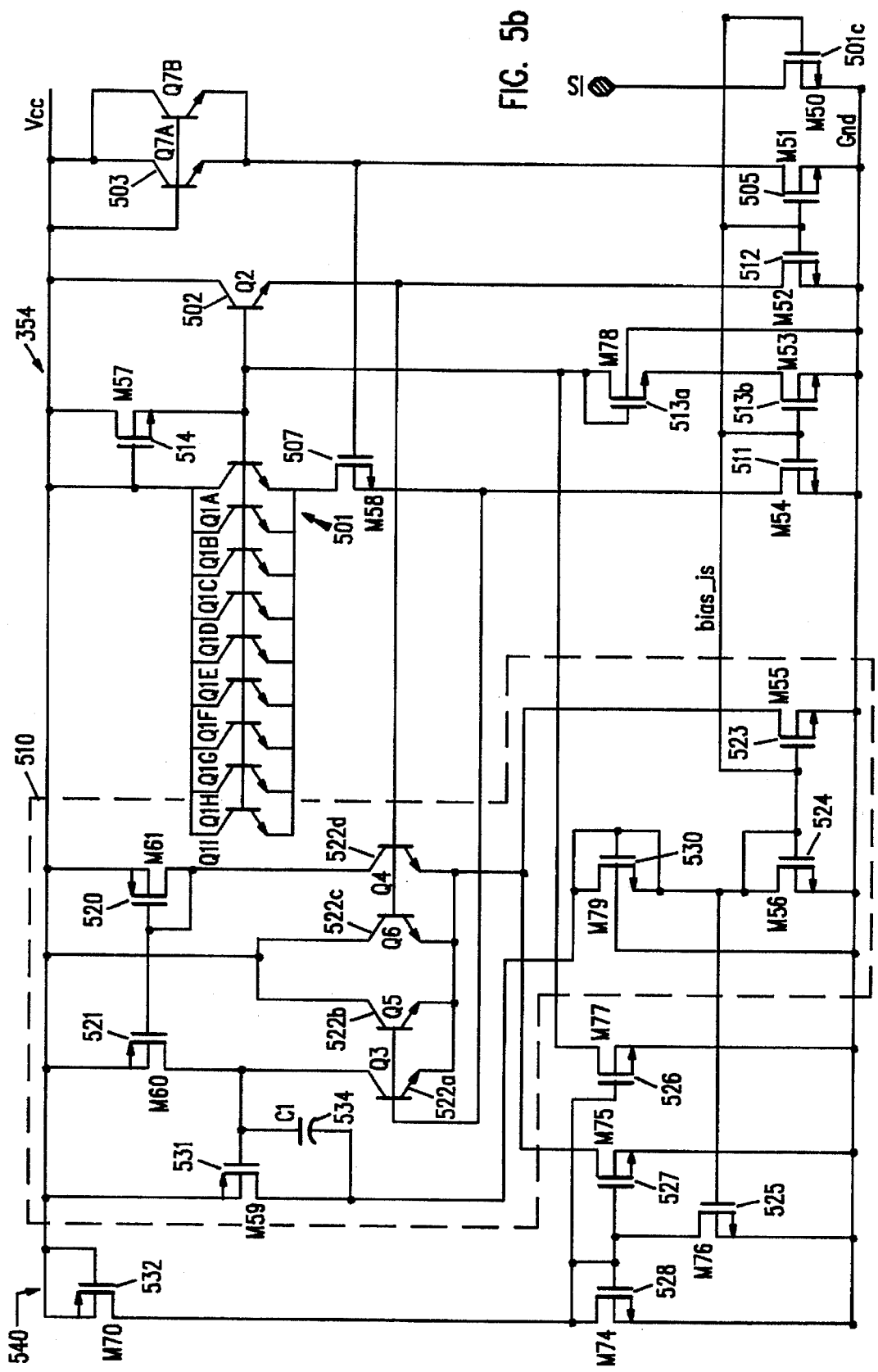
FIG. 5b is a transistor level schematic circuit showing in further detail bias circuit 354 of the present embodiment.

Input protection circuit 351, input stage circuit 352 and output stage circuit 353 all receive a bias voltage at terminal 308 from bias circuit 354. This bias voltage is designed to be process variation insensitive so as to ensure each implementation of comparator 300 provide the same reliable operation regardless of the variations in the manufacturing process. FIGS. 5a and 5b are schematic diagrams of bias circuit 354 of the present invention. Bias circuit 354 is described in patent application entitled "Circuit for Generating a Process Variation Insensitive Reference Bias Current," by Kwok-Fu Chiu, Ser. No. 08/295,331, filed on the same day as the present application, assigned to National Semiconductor Corp., also the assignee of the present invention, bearing Attorney's Docket no. NS-2375. The detailed description of bias circuit 354 and the related drawings in copending patent application, Attorney's docket no. NS-2375, are hereby incorporated by reference.

The present invention provides a substantially limited gate voltage range to an output transistor of an output stage, so as to limit the output current in the output transistor by limiting the gate-to-source voltage of the output transistor. This substantially limited gate voltage range is coupled through a source terminal of a transistor in a logic inverter. In the following description, the substantially limited gate voltage range is generated by a string of diodes. However, any circuit capable of creating a substantially limited voltage range between the supply voltage and the ground voltage is suitable.

FIGS. 4a and 4b are a schematic diagram and a transistor level schematic diagram, respectively, of an embodiment of the present invention in an output stage 400 of a comparator. Corresponding elements in FIGS. 4a and 4b are provided the same reference numerals to simplify this detailed discription. As shown in FIG. 4a, a signal to be output is provided at terminal 305 (terminal 305b in FIG. 4b), which is coupled to the input terminal of inverter 406. Inverter 406 is formed by a pull-up PMOS transistor 406a and a pull-down NMOS transistor 406b. However, the source terminal of transistor 406b is coupled not to the ground supply voltage, but to a reference voltage generated by a reference voltage ("$V_{ref}$") generation circuit 430. Thus, transistor 406b pulls down the voltage of output node 409 only to the voltage $V_{ref}$. Output node 409 controls the gate terminal of pull-up output transistor 407. Reference generation circuit 430 includes a string of diodes (implemented by diode-connected transistors) 401a–401d. The number of diodes to be used is determined by the desired value of the reference voltage $V_{ref}$. The current in diodes 401a–401d is determined by a current source 403, implemented by a NMOS transistor 403 (FIG. 4b). As shown in FIG. 4a and 4b, the voltage at the gate terminal of transistor 402b is limited to four forward-biased diode drops from the supply voltage. Consequently, the voltage on nodes 405 and 409, which are coupled to the source terminal of input transistor 406b and the gate terminal of output transistor 407, respectively, are limited also to four forward-biased diode drops for the supply voltage. In FIG. 4b, a speed-up circuit 404, including PMOS transistor 404a, and NMOS transistors 404b–404d, is provided to ensure a fast AC response, i.e. to ensure that node 405 attains the equilibrium voltage rapidly.

In FIG. 4a, the pull-down portion of output stage 400 is shown as current source 408. FIG. 4b shows such a pull-down portion of output stage 400 to a circuit analogous to the pull-up portion of output stage 400. Specifically, an inverter 456, having a source terminal of a pull-down transistor coupled to a substantially constant reference voltage source, is used to drive output pull-down transistor 457. This substantially constant reference voltage source is provided by reference voltage circuit 480. A speed-up circuit 454 is provided to increase the AC response performance. As shown in FIG. 4b, reference voltage circuit 480 includes diode-connected transistors 451a–451d, NMOS transistors 452a and 452b, and current source 453 (i.e. PMOS transistor 453). Inverter 456 includes PMOS transistor 456a and NMOS transistor 456b. In inverter 456, the source terminal of PMOS transistor 456a is coupled to receive the output substantially constant voltage of reference voltage circuit 480, thereby clamping the voltage at node 459, i.e. gate terminal of output transistor 457, to four diode forward-biased voltage drops above ground voltage.

Figure 6A:
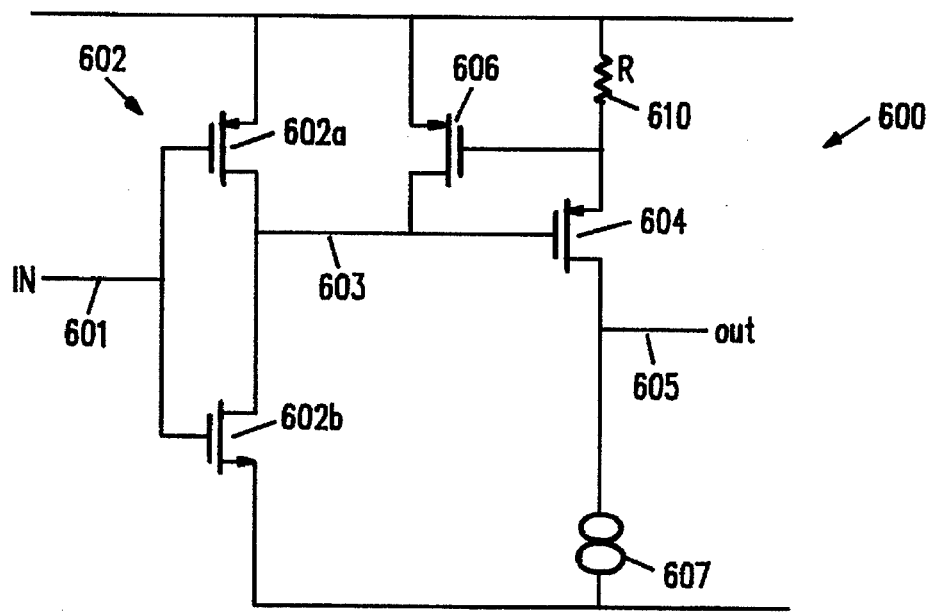
FIG. 6a is a prior art output circuit 600 using a resistor 610 to limit the short circuit current.
Figure 6B:
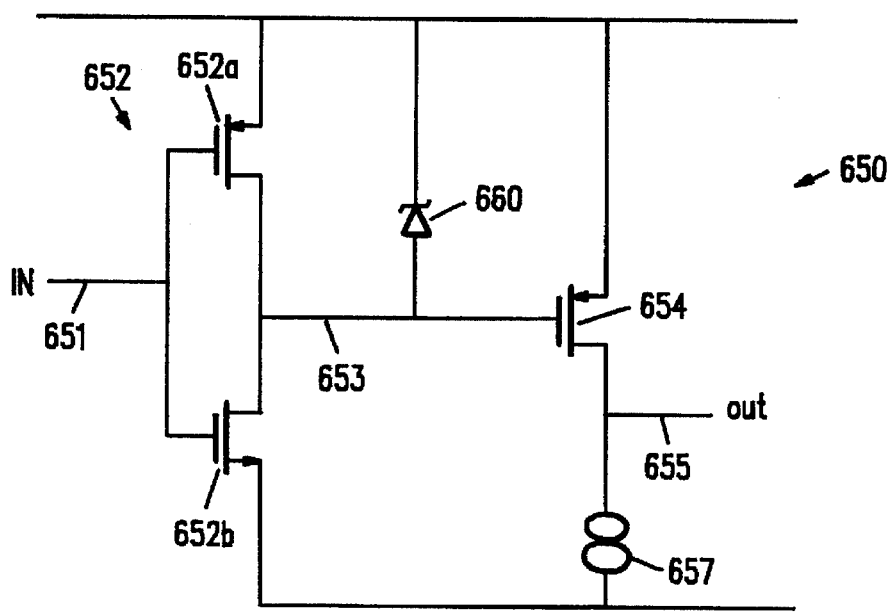
FIG. 6b is a prior art output circuit 650 using a zener diode 660 to limit the short circuit current.

The present invention provides the advantage that the gate terminal of an output transistor of an input stage is clamped to a predetermined voltage without a substantial leakage current, as in the use of the zener diode in the prior art circuit shown in FIG. 6b. The output transistor of such an output stage attains rail-to-rail voltage swing.

The above detailed description is provided to illustrate the specific embodiments of the present invention and is not intended to be limiting. Numerous variations and modification within the scope of the present invention are possible. The present invention is defined by the following claims.

We claim:

1. A comparator circuit, comprising:

an input protection circuit for minimizing an offset voltage performance ("$V_{os}$"), said input protection circuit receiving a differential input signal and providing a differential output signal corresponding to said differential input signal;

an input stage circuit receiving said differential output signal, for providing a comparator output signal indicating whether said differential input signal is positive or negative;

an output stage circuit for amplification of said comparator output signal, said output stage coupled between a first supply voltage and a second supply voltage, and including an output transistor having a gate terminal limited to a reference voltage between said first supply voltage and said second supply voltage; and a bias circuit for providing a bias voltage used in said input protection circuit and said input stage circuit.

2. A comparator circuit as in claim 1, wherein said reference voltage is generated by a plurality of serially connected diodes coupled between said first supply voltage and said second supply voltage.

3. An output circuit as in claim 1, wherein said reference voltage is generated by a plurality of serially connected transistors coupled between said first supply voltage and said second supply voltage.

4. A comparator circuit as in claim 1, further comprising a speed-up circuit for accelerating attainment of said reference voltage at said gate terminal of said output transistor.

5. A comparator circuit as in claim 1, wherein said output stage circuit comprises a logic gate coupled to said reference voltage and said comparator output signal, said logic gate configured to provide an output signal to the gate terminal of said output transistor limited in voltage by said reference voltage.

6. A comparator circuit as in claim 5 wherein said logic gate comprises:

a first transistor coupled to receive said first supply voltage, a gate terminal coupled to receive said comparator output signal, and a drain terminal; and a second transistor having a gate terminal coupled to said gate terminal of said first transistor, a drain terminal coupled to said drain terminal of said first transistor and a source terminal coupled to receive said reference voltage.

* * * * *